(12) United States Patent
Moran et al.

(10) Patent No.: US 7,280,575 B2
(45) Date of Patent: Oct. 9, 2007

(54) EYE SAFETY LOGIC WITH COMPENSATION FOR TRANSIENT CONDITIONS

(75) Inventors: Timothy G. Moran, San Jose, CA (US); Greta Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 325 days.

(21) Appl. No.: 10/835,701

(22) Filed: Apr. 30, 2004

(65) Prior Publication Data

US 2005/0195868 A1    Sep. 8, 2005

Related U.S. Application Data

(60) Provisional application No. 60/550,587, filed on Mar. 5, 2004.

(51) Int. Cl.
*H01S 3/00*    (2006.01)
(52) U.S. Cl. .................... 372/38.02; 372/38.09
(58) Field of Classification Search .. 372/29.01–29.02, 372/38.02, 38.07, 38.09, 38.1, 72; 250/214 R, 250/205, 238; 398/118–121, 138–139
See application file for complete search history.

(56) References Cited

U.S. PATENT DOCUMENTS

| | | | | |
|---|---|---|---|---|
| 5,665,942 A | * | 9/1997 | Williams et al. | 178/19.01 |
| 5,793,477 A | * | 8/1998 | Laakmann | 356/28 |
| 5,953,110 A | * | 9/1999 | Burns | 356/5.01 |
| 6,658,030 B1 | * | 12/2003 | Baumgartner et al. | 372/29.021 |
| 6,661,817 B1 | * | 12/2003 | Ames et al. | 372/29.021 |
| 6,792,020 B2 | * | 9/2004 | Romm | 372/38.09 |
| 6,999,011 B2 | * | 2/2006 | Case et al. | 341/118 |
| 7,120,179 B2 | * | 10/2006 | Fennelly et al. | 372/38.02 |

* cited by examiner

*Primary Examiner*—Douglas W. Owens
*Assistant Examiner*—Jimmy Vu
(74) *Attorney, Agent, or Firm*—Workman Nydegger

(57) ABSTRACT

An eye safety detection circuit for use in a laser transmitter. The eye safety detection circuit shuts the laser down if the laser is emitting excessive optical energy to the point of being unsafe to a user. The eye safety detection circuit includes a laser current detection circuit that is configured to detect when there is a potential that the laser is emitting light at levels that exceed a predetermined threshold. If the laser were to immediately turn off under this condition, the laser may be turned off prematurely. Instead, the eye safety detection circuit includes a timer circuit that causes the laser to cease operation only after one or more such conditions have been met for a predetermined period of time.

28 Claims, 4 Drawing Sheets

EYE SAFETY LOGIC WITH COMPENSATION FOR TRANSIENT CONDITIONS

CROSS-REFERENCE TO RELATED APPLICATIONS

This application claims the benefit of United States Provisional Application No. 60/550,587 filed Mar. 5, 2004, which is incorporated herein by reference in its entirety.

BACKGROUND OF THE INVENTION

1. The Field of the Invention

The present invention relates generally to telecommunications systems. More particularly, the present invention relates to an eye safety shutdown mechanism in a laser transmitter with compensation for transient conditions such as start-up conditions.

2. Background and Relevant Art

Fiber optic technology is increasingly employed as a method by which information can be reliably transmitted via a communications network. Networks employing fiber optic technology are known as optical communications networks, and are marked by high bandwidth and reliable, high-speed data transmission.

Optical communications networks employ optical transceivers in transmitting information via the network from a transmission node to a reception node. An optical transceiver at the transmission node receives an electrical signal from a network device, such as a computer, and converts the electrical signal via a laser to an optical signal. The optical signal can then be emitted by the transceiver and transmitted in a fiber optic cable via the optical network. The optical signal is then received by a reception node of the network. Once received by the reception node, the optical signal is fed to another optical transceiver for conversion via a photodetector into electrical signals for forwarding or further processing.

As the optical communications network employs optics as a mechanism for data transfer, it is important that the optical signal presents no health hazard to bystanders. For example, if the optical cable were to become unplugged, the optical signal is no longer contained and may be freely emitted into the environment. It is possible that the emitted optical signal may be received by a human eye. If the intensity of the optical signal is too high, this could harm the human eye. Accordingly, for safety purposes, the optical intensity of the laser is kept low such that eye safety is assured even should the optical cable become unplugged. Conventional optical transceivers thus have eye safety mechanisms that shut down the optical transceiver should the optical intensity become too great.

While this promotes eye safety, there can be transient conditions during which the optical intensity falls outside of a desirable operating range. However, in many of such transient conditions, there is no significant safety hazard. For example, the optical intensity may only be large for a small time period not significant enough to cause harm. Furthermore, startup conditions may cause the optical signal to actually be below the desirable operating range thereby presenting no eye safety hazard. Shutting down the optical transceiver under such conditions is too extreme since the optical transceiver is rendered inoperative despite there being no real eye safety hazard.

While some conventional eye safety mechanisms provide for some level of assurance that a shut down of the transceiver will not occur unless there is a safety hazard, what would be advantageous are mechanisms that further increase this level of assurance. It would further be desirable if the eye safety mechanism could be integrated even without the assistance of an external controller.

BRIEF SUMMARY OF THE INVENTION

The foregoing problems with the prior state of the art are overcome by the principles of the present invention. The principles of the present invention relates to an eye safety detection circuit for use in a laser transmitter. The eye safety detection circuit shuts the laser down if the laser is emitting excessive optical energy to the point of being unsafe to a user. However, the eye safety detection circuit avoids shut down when there is no real threat to a surrounding user due to a transient condition such as, for example, during start up of the laser transmitter.

The eye safety detection circuit includes a laser current detection circuit that is configured to detect when there is a potential that the laser is emitting light at levels that exceed a predetermined threshold. If the laser were to immediately turn off under this condition, the laser may be turned off unnecessarily, for there may be transient conditions that affect any given instantaneous level of laser emissions. Instead, the eye safety detection circuit includes a timer circuit that causes the laser to cease operation only after one or more conditions have been met for a predetermined period of time. Therefore, laser shut down is avoided in transient conditions in which there is no significant safety concern, while performing laser shut down in the case of a more persistent problem.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to an eye safety detection circuit for use in a laser transmitter. The eye safety detection circuit shuts the laser down if the laser is emitting excessive optical energy to the point of being unsafe to a user. However, the eye safety detection circuit avoids shut down in transient conditions when there is no real threat to a surrounding user due to a transient condition such as, for example, the start up of the laser transmitter.

Figure 1:
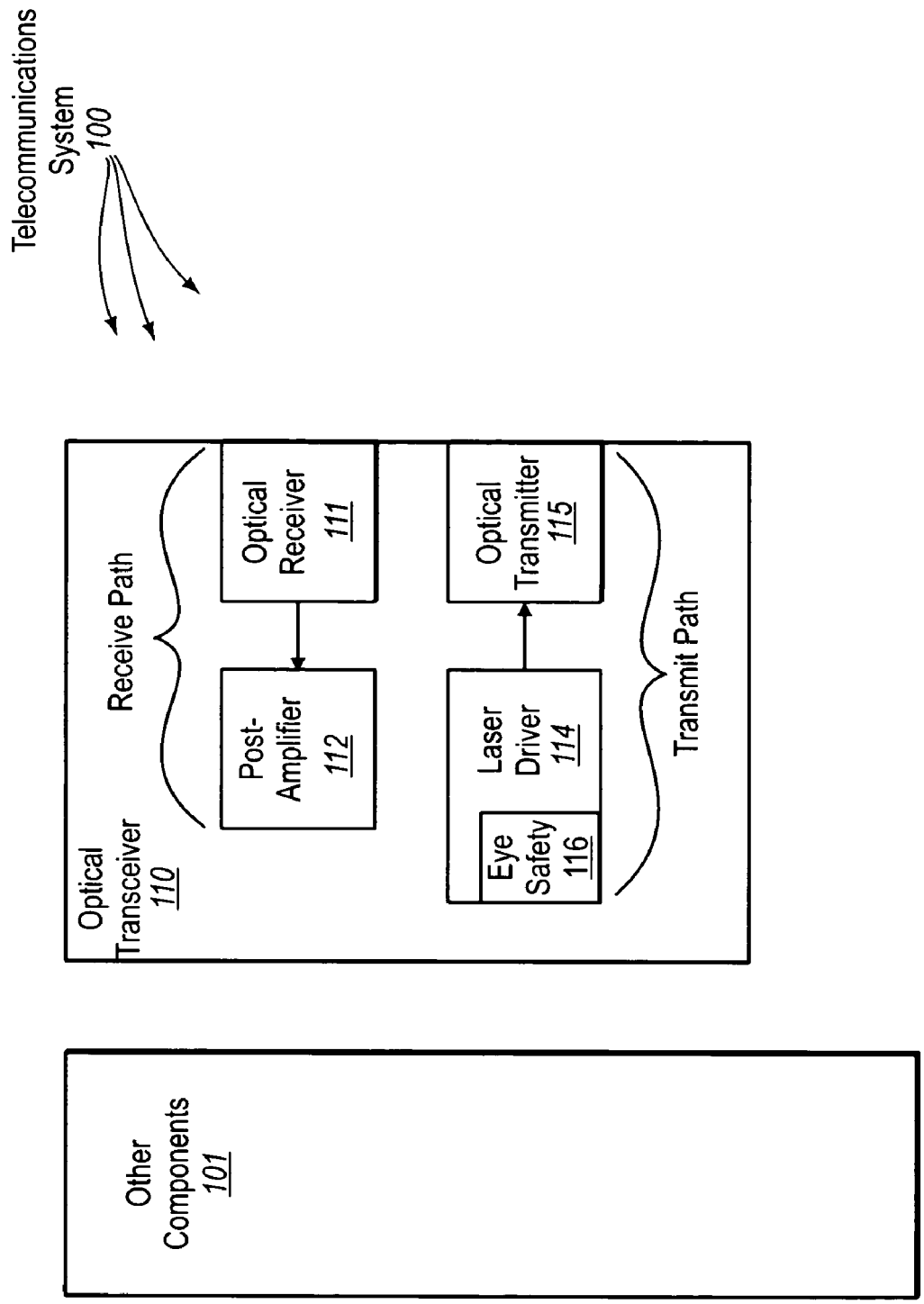
FIG. 1 schematically illustrates a telecommunications system in which an optical transceiver has incorporated therein an eye safety detection circuit in accordance with the principles of the present invention.

Turning to the drawings, FIG. 1 schematically illustrates a telecommunications system 100 that includes an optical transceiver 110 amongst potentially other components 101. The optical transceiver 110 operates to receive an incoming optical signal and report the signal to the other components 101. Specifically, an optical receiver 111 receives the incoming optical signal and converts the optical signal into a corresponding electrical signal. The electrical signal is then provided to a post-amplifier 112 for appropriate amplification. The resulting electrical signal may then be used by, for example, a host computing system. The other components 101 may include the host computing system that uses the incoming signal. Accordingly, a receive path is represented by the optical receiver 111 and the post-amplifier 112.

The optical transceiver 110 also operates to transmit outgoing optical signals. A laser driver 114 properly generates an appropriate electrical signal to an optical transmitter 115. The optical transmitter 115 converts the electrical signal into an optical signal for transmission. Accordingly, a transmit path is represented by the laser driver 114 and the optical transmitter 115. The optical transmitter 115 may be, for example, a laser and thus will frequently be referred to herein as laser 115.

Figure 2:
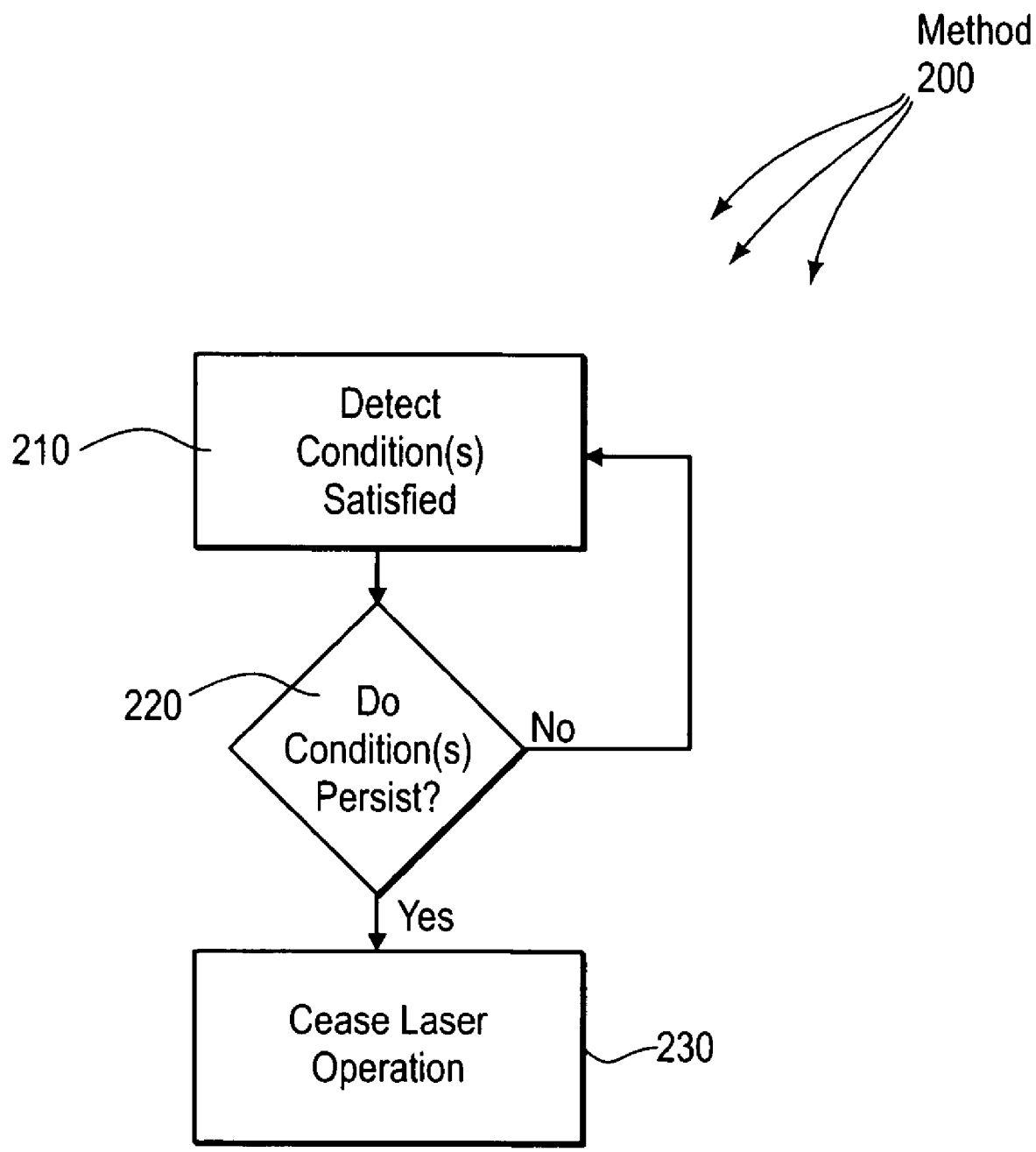
FIG. 2 illustrates a flowchart of a method for the eye safety detection circuit to monitor for eye safety hazards in accordance with the principles of the present invention.

The laser driver 114 includes an eye safety detection circuit 116. The eye safety detection circuit 116 measures parameters throughout the laser driver 114 and turns the laser off if it appears that an eye safety hazard may be occurring. FIG. 2 illustrates a flowchart of a method 200 for automatically detecting an eye safety fault condition in a laser transmitter while accounting for transient conditions such as those that occur during start up.

The method includes an act of detecting that one or more conditions have been satisfied 210. Each condition is suggestive of a potential eye safety hazard with the laser 115. In other words, the conditions are suggestive of the potential that there may be too much current in the laser to the extent that the eye could be harmed if exposed to the emitted laser. This is not to say that each condition is necessarily deterministic of an eye safety hazard, but it may be at least suggestive. For example, the condition may be indicative of either there being too much current in the laser 115, or else a malfunction of the mechanism that detects the current passing through the laser 115. In either case, the laser 115 should be shut down for eye safety reasons should the problem persist.

Once the one or more conditions have been satisfied, the laser is not shut down immediately. Instead, the laser is shut down only if the one or more conditions persist for a predetermined period of time. Accordingly, the method 200 includes an act of determining whether the one or more conditions have persisted for the predetermined period of time (decision block 220). If all of the one or more conditions do not persist for the predetermined period of time (No in decision block 220), then the method 200 returns to once again wait for all of the one or more conditions to occur (act 210). On the other hand, if the predetermined period of time does elapse (Yes in decision block 220), then the eye safety circuit ceases operation of the laser (act 230).

Figure 3:
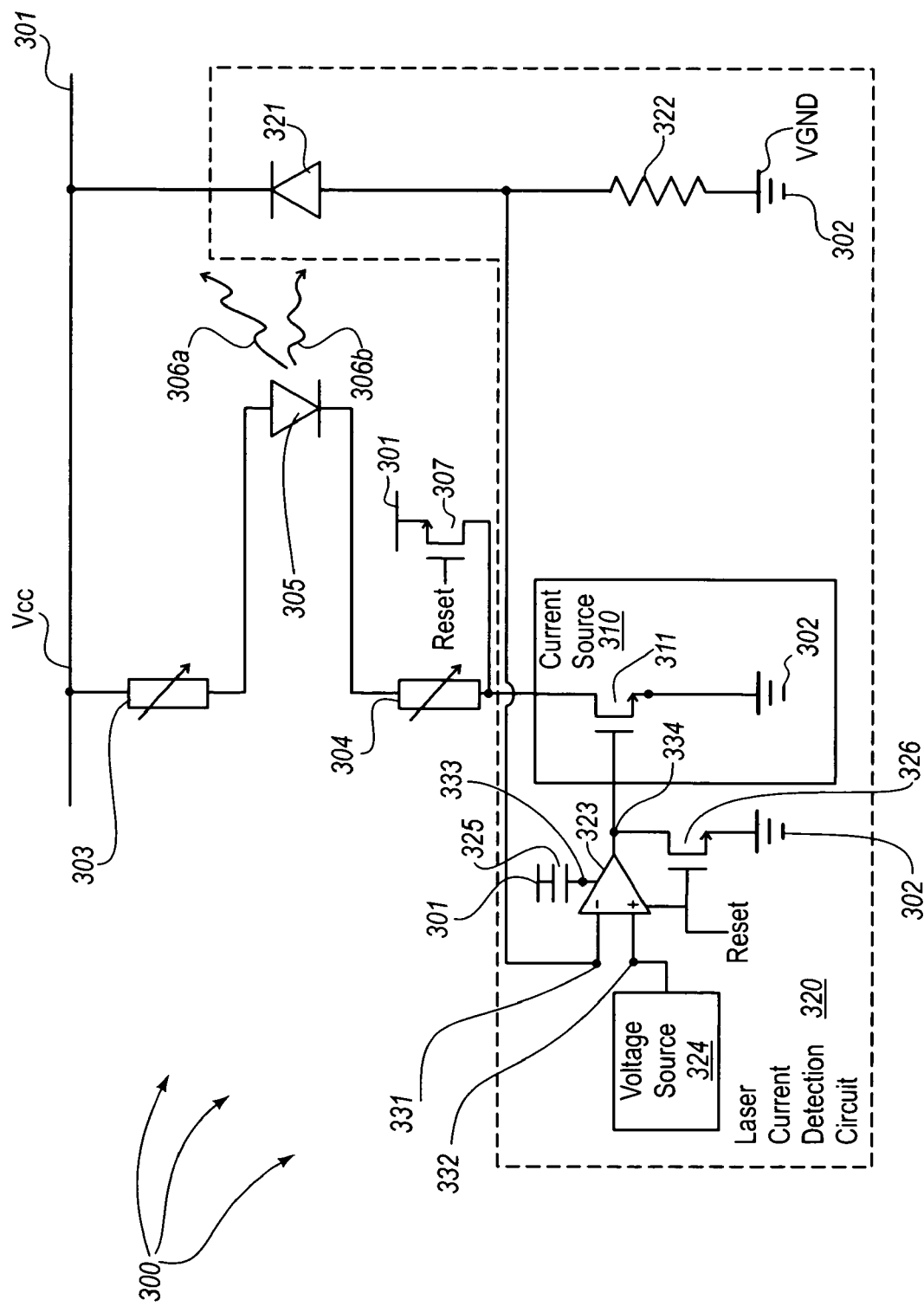
FIG. 3 illustrates a circuit diagram of an environment that includes the eye safety detection circuit with surrounding circuitry, the eye safety detection circuit of FIG. 3 representing an example of the eye safety detection circuit of FIG. 1.

FIG. 3 illustrates a circuit diagram of an environment 300 that includes an eye safety detection circuit 320 amongst other components. The eye safety detection circuit 320 of FIG. 3 represents an example of the eye safety detection circuit 116 of FIG. 1. Due to the high level of integration and functional relation between the eye safety detection circuit 320 and its surrounding circuitry, much of the surrounding circuitry is also shown in FIG. 3.

For instance, the environment 300 includes a current path in which a current source (or sink) 310 draws current from a high voltage source 301 (for example, Vcc) through a variable resistor 303, through a laser diode 305, and through variable resistor 304. The laser diode 305 represents an example of the optical transmitter 115 or laser 115 of FIG. 1. The remaining components may reside within the laser driver 114 of FIG. 1. The current may vary depending on the settings of the current source 310 and the variable resistors 303 and 304.

The amount of light emitted by the laser diode 305 is a function of the current passing through the laser diode 305. At currents below the threshold voltage of the laser diode 305, the laser diode 305 will not emit substantial amounts of light. As the current increases above this threshold voltage, the laser diode will emit light in magnitudes approximately linearly with increases in current. At some point, the laser diode 305 will saturate at a high level of optical emissions.

For example, the laser diode 305 is illustrated as emitting light 306. A portion 306a of the light 306 is provided onto the network. However, another portion 306b of the light 306 is used by the laser current detection circuitry 320 to regulate the current passing through the laser diode 306 such that the intensity of the light 306 would not be hazardous if absorbed into the human eye.

Specifically, the light 306b emitted by the laser diode 305 is absorbed by the monitor diode 321, which (in combination with the resistor 322) causes the monitor diode 321 to measure the light emitted by the laser diode 305 by providing a voltage at node 331 that is a function of the intensity of the light 306b. In addition, a voltage source 324 is configured to provide a voltage that approximates the voltage that the monitor diode 321 should provide if the laser diode 305 is emitting at normal levels that do not present an eye safety hazard.

An amplifier 323 receives the voltage provided by the monitor diode 321 at its first input terminal corresponding to node 331, and receives the voltage provided by the voltage source 324 at its second input terminal corresponding to node 332. The amplifier 323 generates a corresponding voltage at its output terminal corresponding to node 334. During normal operation when there is no eye safety hazard, the signal RESET is low. Accordingly, the nMOS field effect transistor 326 allows the output terminal of the amplifier 323 to float during normal operation. Furthermore, the node 331 is permitted to float since the node 331 is isolated from the high voltage source 301 via the pMOS field effect transistor 307. Accordingly, during normal operation, the amplifier 323 controls the amount of current drawn by the current source 310. In the illustrated embodiment in which the current source 310 is simply an nMOS field effect transistor 311, the output terminal of the amplifier 323 may be coupled to the gate terminal of the nMOS field effect transistor 311.

During normal operation, there is a feedback loop represented by monitor diode 321, node 331, and the amplifier 323 that causes the current source 310 to draw just enough current through the laser diode 305 that the voltage generated by the monitor diode 321 onto node 331 is approximately equal to the voltage provided by the voltage source 324 on the node 332. This keeps the amount of light emitted by the laser diode 305 in check.

However, the laser current detection circuitry 320 can fail. For example, suppose that node 331 is shorted to ground. In this condition, the negative input to the amplifier 323 could never be equalized with the positive input to the amplifier 323. Accordingly, the current source 310 would draw more and more current through the laser diode 305. This would cause the laser diode to ultimately emit excessive intensities of light thereby resulting in an eye safety hazard. Alternatively, there may be a short between the laser diode 305 and the current source 310. This would also increase the amount of current flowing through the laser diode 305 since the resistance of the current source 310 would be removed. The current source 310 would then have no control over the current through the laser diode 305 to bring the current back down to normal levels. Once again, an eye safety hazard may result. Even if an eye safety hazard did not result from either of these conditions, the presence of the condition indicates that there has been a malfunction of the laser current detection circuit 320. However, this alone would also justify a shut down of the laser diode 305 since the intensity of the laser diode 305 could no longer be monitored.

Figure 4:
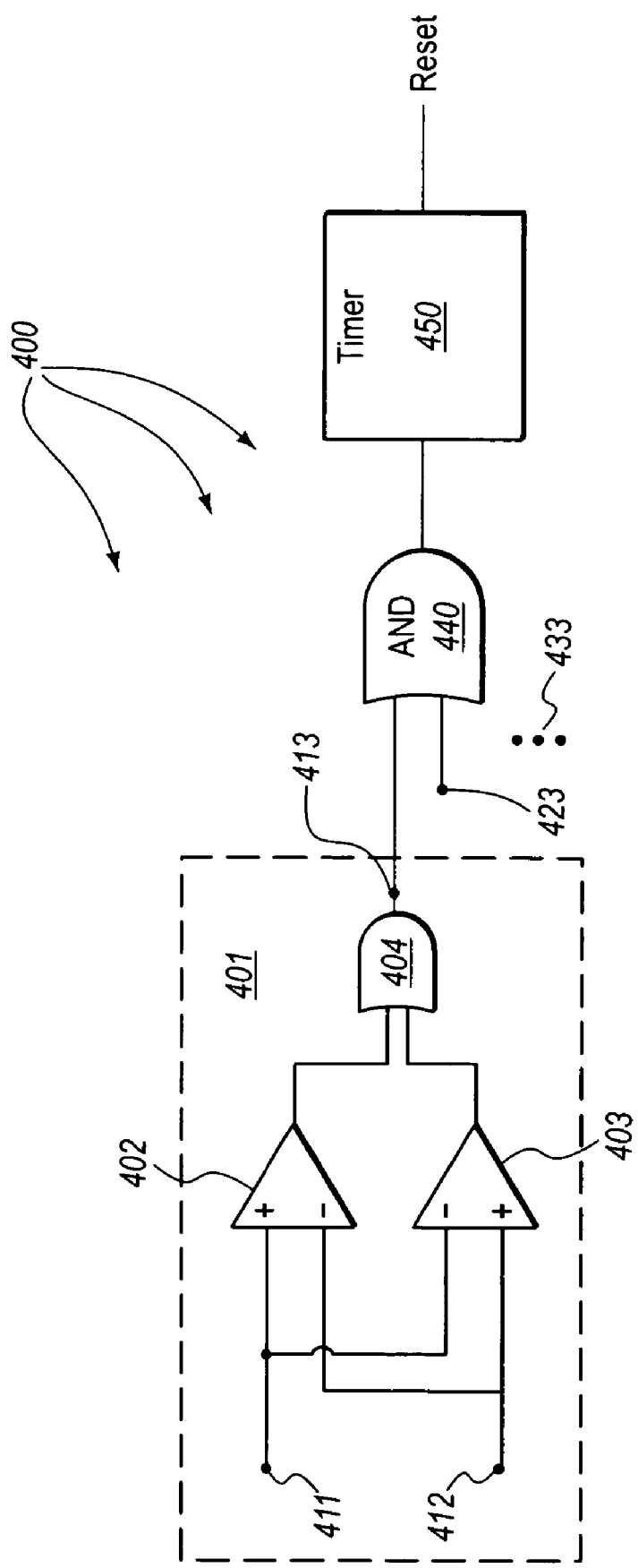
FIG. 4 illustrates additional elements of the eye safety detection circuit of FIG. 3.

FIG. 4 illustrates circuitry 400 that includes a window comparator 401. The window comparator 401 may be used to determine when different nodes within a circuit are not within a given range. In this configuration, the comparators 402 and 403 have a certain offset. If the differential voltage at the input terminals 411 of the window comparator 401 were not within a given range defined by the offset, the logical OR gate 404 would generate a high signal.

For example, the input terminals 411 and 412 of the window comparator 401 of FIG. 4 could correspond to the amplifier input terminals 331 and 332 of FIG. 3. In this configuration, the window comparator 401 detects when there is a potential that the laser diode 305 is emitting light at levels that are outside of a given range, or exceed a certain predetermined threshold. This would mean that the input terminals of the amplifier 323 had not sufficiently equalized thereby suggesting that there is a potential for too much current passing through the laser diode 305 and/or that the laser current detection circuit 320 has malfunctioned.

The condition in which the input terminals 331 and 332 of the amplifier 323 are not sufficiently equalized represents one condition that is suggestive of too much current through the laser diode 305. This condition is reflected by the node 413 by the output terminal of the window comparator 401 being high. Similar window comparators may be used to generate other signals that represent a condition in which two voltages are outside of a given range with respect to each other. For example, a signal on the node 423 may be high if the voltage across the compensation capacitor 325 of the amplifier 323 is outside of a given range. Other similar signals may be generated to represent the satisfaction of other conditions as represented by the vertical ellipses.

Each of the condition signals is provided to an AND gate 440, which generates a high output signal only if all of the condition signals are high. Accordingly, the generation of the high output signal by the AND gate 440 represents an example of the act of detecting when one or more conditions have been met (act 210), each condition suggestive of too much current in the laser diode or a malfunction of the current detection circuit.

The signal from the AND gate 440 is provided to a timer circuit 450. The timer circuit 450 is configured to generate a high RESET signal if the signal provided by the AND gate 440 remains high for a predetermined amount of time. The predetermined amount of time may be, for example, a number of clock cycles that should be sufficient for the laser driver 114 to stabilize during start up. Accordingly, the RESET signal is only asserted if the one or more conditions have been present for a predetermined amount of time. Therefore, if the RESET signal is asserted, there is higher assurance that either there is excessive current in the laser diode 305 caused by persistent problems, and/or that there is a malfunction in the current detection circuit 320 due to persistent problems. If there was just a transient problem, the output signal from the AND gate 440 may be high momentarily, but the RESET signal should not be asserted. Therefore, ill-advised shut downs of the laser driver 114 due to transient conditions may be avoided.

Once the RESET signal is asserted, the laser current is dropped to below the laser threshold voltage by, for example, coupling the gate terminal of the nMOS field effect transistor 326 to ground thereby shutting down the current source 310. Furthermore, the drain terminal of the nMOS field effect transistor 311 may be coupled to the high voltage source through the pMOS field effect transistor 307. The nMOS field effect transistor 326 coupled to the signal RESET, and the pMOS effect transistor 307 in combination represent an example of a reset circuit that is configured to cease operation of the laser driver upon activation. In addition, the anode terminal of the laser diode 305 may be pulled low if needed with the resistance of the variable resistor 303 being maximized. Accordingly, the laser diode 305 may be shut off even if there is a short between the cathode terminal of the laser diode 305 and the current source 310.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A circuit for automatically detecting an eye safety fault condition in a laser transmitter while accounting for transient conditions, the circuit comprising the following:

a laser current detection circuit configured to detect when there is a potential that the laser is emitting light at levels that exceed a predetermined threshold; and a timer circuit configured to cause the laser to cease operation when one or more conditions has been satisfied for a predetermined period of time, wherein the one or more conditions at least includes the condition that the laser current detection circuit has detected that there has been the potential that the laser is emitting light at levels that exceed a first predetermined threshold;

wherein the laser current detection circuit comprises the following:

a monitor diode configured to measure the light emitted by the laser and provide a voltage that is dependent upon the light measured;

a current source or sink configured to provide current through the laser;
a voltage source; and
a comparator;
wherein the voltage source is configured to provide to the comparator a voltage approximating the voltage that the monitor diode should provide if the laser is emitting a normal light emission; and
wherein the comparator is configured to detect when the voltage provided by the voltage source and the voltage provided by the monitor diode are such that there is the potential that the laser is emitting light at levels that exceed the first predetermined threshold.

2. A circuit in accordance with claim 1, wherein the laser current detection circuit is configured to detect that there is a potential that the laser is emitting light at levels that exceed a predetermined threshold when the laser is actually emitting light at levels that exceed the predetermined threshold.

3. A circuit in accordance with claim 1, wherein the laser current detection circuit is configured to detect that there is a potential that the laser is emitting light at levels that exceed a predetermined threshold when the laser current detection circuit is malfunctioning.

4. A circuit in accordance with claim 1, further comprising the following:
a reset circuit configured to cease operation of the laser upon activation, wherein the timer circuit is configured to activate the reset circuit if the one or more conditions have been satisfied for the predetermined period of time.

5. A circuit in accordance with claim 1, wherein the predetermined period of time exceeds the amount of time normally required for the laser to power up to normal operation.

6. A circuit in accordance with claim 1, further comprising the following:
an amplifier, wherein the voltage provided by the voltage source is provided to a first input terminal of the amplifier, and the voltage provided by the monitor diode is provided to a second input terminal of the amplifier, wherein a voltage at the output terminal of the amplifier controls the amount of current provided by the current source or sink.

7. A circuit in accordance with claim 1, wherein the voltage source is a digital-to-analog converter.

8. A circuit in accordance with claim 1, wherein the time circuit is configured to reset if any of the one or more conditions is no longer satisfied.

9. A circuit for automatically detecting an eye safety fault condition in a laser transmitter while accounting for transient conditions, the circuit comprising the following:
a laser current detection circuit configured to detect when there is a potential that the laser is emitting light at levels that exceed a predetermined threshold;
a timer circuit configured to cause the laser to cease operation when one or more conditions has been satisfied for a predetermined period of time, wherein the one or more conditions at least includes the condition that the laser current detection circuit has detected that there has been the potential that the laser is emitting light at levels that exceed a first predetermined threshold;
a compensation capacitor; and
a window comparator circuit configured to detect when a voltage drop across the compensation capacitor is not within a predetermined range,
wherein the timer circuit is configured to cause the laser to cease operation if both of the following conditions have been true for at least the predetermined period of time:
the laser current detection circuit has detected that there has been the potential; and
the window comparator circuit has detected that the voltage drop across the compensation capacitor is not within the predetermined range.

10. A circuit in accordance with claim 9, wherein the window comparator circuit comprises one or more comparators and one or more AND gates.

11. A method for automatically detecting an eye safety fault condition in a laser transmitter while accounting for transient conditions, the method comprising the following:
an act of detecting when there is a potential that the laser is emitting light at levels that exceed a predetermined threshold; and
an act of causing the laser to cease operation when one or more conditions has been satisfied for a predetermined period of time, wherein the one or more conditions at least includes the condition that a laser current detection circuit has detected that there has been the potential that the laser is emitting light at levels that exceed a first predetermined threshold;
wherein the act of detecting when there is a potential that the laser is emitting light at levels that exceed a predetermined threshold comprises the following:
measuring a light emitted by a laser;
generating at a monitor diode of the laser current detection circuit a first voltage that is dependent upon the light measured;
providing to an amplifier of the laser current detection circuit a second voltage approximating what the first voltage should be if the laser is emitting a normal light emission; and
detecting when the first and second voltages are at levels indicative of the laser emitting light at levels that exceed the first predetermined threshold.

12. A method in accordance with claim 11, wherein the act of causing the laser to cease operation comprises the following:
an act of activating a reset circuit that is configured to cease operation of the laser upon activation.

13. A method in accordance with claim 11, wherein the predetermined period of time exceeds the amount of time normally required for the laser to power up to normal operation.

14. A method in accordance with claim 11, further comprising the following:
amplifying a difference between the first and second voltages to control the amount of current provided through the laser.

15. A telecommunications system that contains a laser transmitter, and a circuit for automatically detecting an eye safety fault condition in the laser transmitter while accounting for transient conditions, the circuit comprising the following:
a laser current detection circuit configured to detect when there is a potential that the laser is emitting light at levels that exceed a predetermined threshold; and
a timer circuit configured to cause the laser to cease operation when one or more conditions has been satisfied for a predetermined period of time, wherein the one or more conditions at least includes the condition that the laser current detection circuit has detected that there has been the potential that the laser is emitting light at levels that exceed a first predetermined threshold;

wherein the laser current detection circuit comprises the following:

a monitor diode configured to measure the light emitted by the laser and provide a voltage that is dependent upon the light measured;

a current source or sink configured to provide current through the laser;

a voltage source; and a comparator;

wherein the voltage source is configured to provide to the comparator a voltage approximating the voltage that the monitor diode should provide if the laser is emitting a normal light emission; and wherein the comparator is configured to detect when the voltage provided by the voltage source and the voltage provided by the monitor diode are such that there is the potential that the laser is emitting light at levels that exceed the first predetermined threshold.

16. A telecommunications system in accordance with claim 15, wherein the eye safety circuit further comprises the following:

a reset circuit configured to cease operation of the laser upon activation, wherein the timer circuit is configured to activate the reset circuit if the one or more conditions have been satisfied for the predetermined period of time.

17. A telecommunications system in accordance with claim 15, wherein the predetermined period of time exceeds the amount of time normally required for the laser to power up to normal operation.

18. A telecommunications system in accordance with claim 15, wherein the eye safety circuit further comprises the following:

an amplifier, wherein the voltage provided by the voltage source is provided to a first input terminal of the amplifier, and the voltage provided by the monitor diode is provided to a second input terminal of the amplifier, wherein a voltage at the output terminal of the amplifier controls the amount of current provided by the current source or sink.

19. A telecommunications system in accordance with claim 15, wherein the telecommunications system is a 1 G laser transceiver.

20. A telecommunications system in accordance with claim 15, wherein the telecommunications system is a 2.5 G laser transceiver.

21. A telecommunications system in accordance with claim 15, wherein the telecommunications system is a 4 G laser transceiver.

22. A telecommunications system in accordance with claim 15, wherein the telecommunications system is a 10 G laser transceiver.

23. A telecommunications system in accordance with claim 15, wherein the telecommunications system is a laser transceiver suitable for fiber channels greater than 10 G.

24. A telecommunications system in accordance with claim 15, wherein the telecommunications system is an XFP laser transceiver.

25. A telecommunications system in accordance with claim 15, wherein the telecommunications system is an SFP laser transceiver.

26. A telecommunications system in accordance with claim 15, wherein the telecommunications system is an SFF laser transceiver.

27. A telecommunications system that contains a laser transmitter, and a circuit for automatically detecting an eye safety fault condition in the laser transmitter while accounting for transient conditions, the circuit comprising the following:

a laser current detection circuit configured to detect when there is a potential that the laser is emitting light at levels that exceed a predetermined threshold;

a timer circuit configured to cause the laser to cease operation when one or more conditions has been satisfied for a predetermined period of time, wherein the one or more conditions at least includes the condition that the laser current detection circuit has detected that there has been the potential that the laser is emitting light at levels that exceed a first predetermined threshold;

a compensation capacitor; and a window comparator circuit configured to detect when a voltage drop across the compensation capacitor is not within a predetermined range, wherein the timer circuit is configured to cause the laser to cease operation if both of the following conditions have been true for at least the predetermined period of time:

the laser current detection circuit has detected that there has been the potential; and the window comparator circuit has detected that the voltage drop across the compensation capacitor is not within the predetermined range.

28. A telecommunications system in accordance with claim 27, wherein the window comparator circuit comprises one or more comparators and one or more AND gates.

* * * * *